US011852907B2

(12) United States Patent
Kim

(10) Patent No.: US 11,852,907 B2
(45) Date of Patent: Dec. 26, 2023

(54) AGING PALLET

(71) Applicant: LG Display Co., Ltd., Seoul (KR)

(72) Inventor: Ji Woong Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 24 days.

(21) Appl. No.: 17/980,408

(22) Filed: Nov. 3, 2022

(65) Prior Publication Data

US 2023/0213794 A1     Jul. 6, 2023

(30) Foreign Application Priority Data

Dec. 31, 2021   (KR) .................... 10-2021-0194733

(51) Int. Cl.
*G02F 1/13*          (2006.01)
*H10K 71/00*         (2023.01)

(52) U.S. Cl.
CPC ......... *G02F 1/1303* (2013.01); *H10K 71/831* (2023.02)

(58) Field of Classification Search
CPC .............................. G02F 1/1303; H10K 71/831
See application file for complete search history.

(56) References Cited

FOREIGN PATENT DOCUMENTS

KR       20110133901 A   * 12/2011   ........... G02F 1/1309

OTHER PUBLICATIONS

English Machine Translation of Kim et al., KR 20110133901 (Year: 2023).*

* cited by examiner

*Primary Examiner* — Donald L Raleigh
(74) *Attorney, Agent, or Firm* — Birch, Stewart, Kolasch & Birch, LLP

(57) ABSTRACT

An aging pallet used in an aging process of a display panel is provided. The aging pallet can include a plurality of trays stacked on a driving unit. Each of the plurality of trays can include a seating portion on which the display panel is mounted, and at least one press bar disposed on the seating portion. The press bar can include protrusions protruding toward the seating portion or holes disposed at a surface of the press body toward the seating portion. Thus, the aging pallet can prevent the damage to the display panel due to particles in the aging process.

11 Claims, 4 Drawing Sheets

AGING PALLET

CROSS-REFERENCE TO RELATED APPLICATIONS

This application claims priority to Korean Patent Application No. 10-2021-0194733, filed in the Republic of Korea on Dec. 31, 2021, the entire contents of which are hereby incorporated by reference into the present application.

BACKGROUND OF THE INVENTION

Field of the Invention

The present disclosure relates to an aging pallet, and more particularly to an aging pallet which can be used in an aging process of a display panel, a display device or the like.

Discussion of the Related Art

Generally, the operating characteristics of a display panel providing an image to a user can change over time. For example, a method of forming the display panel can include an aging process performed at a high temperature to improve reliability. The aging process can be performed while the display panel is mounted or seated on a tray. The aging process can be performed for a long time. Thus, a polarizer attached to a surface of the display panel can be bent by the aging process.

In an aging pallet used in the aging process, the tray on which the display panel is mounted can include at least one press bar. A surface of the display panel can be pressed by the press bar during the aging process. However, in the aging pallet, the surface of the display panel can be damaged by particles (or foreign substances) located on a surface of the press bar.

SUMMARY OF THE INVENTION

Accordingly, the present disclosure is directed to an aging pallet that substantially obviates one or more problems due to limitations and disadvantages of the related art.

An object of the present disclosure is to provide an aging pallet capable of preventing the damage to the display panel due to the aging process.

Another object of the present disclosure is to provide an aging pallet capable of minimizing a pressure on a surface of the display panel mounted on the seating portion caused by the particles located on the surface of the press bar.

Additional advantages, objects, and features of the disclosure will be set forth in part in the description which follows and in part will become apparent to those having ordinary skill in the art upon reading of the following description or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the present disclosure, as embodied and broadly described herein, there is provided an aging pallet comprising a base plate. A driving unit is disposed on the base plate. A plurality of trays are stacked on the driving unit. Each of the plurality of trays includes a seating portion and at least one press bar. A display panel is mounted on the seating portion. The press bar is disposed on the seating portion. The press bar includes a press body and a plurality of protrusions. The press body extends in a direction which may be referred to as an extension direction. The plurality of protrusions protrudes from the press body in a direction toward the seating portion.

The plurality of protrusions can be disposed side by side along the extension direction of the press body. Each of the plurality of protrusions can be spaced apart from adjacent protrusions.

Each of the plurality of protrusions can include a first region disposed close to the seating portion, and a second region disposed close to the press body. A width of the first region can be greater than a width of the second region.

Each of the plurality of protrusions can include a third region disposed between the press body and the second region. A width of the third region can be smaller than the width of the first region and the width of the second region.

Each of the plurality of trays can include a magnetic element disposed between adjacent protrusions of the press bar.

A thickness of the magnetic element can be smaller than a thickness of each protrusion.

The magnetic element can surround a side of each protrusion.

An end of each protrusion toward the seating portion can have a curved surface.

In another embodiment, there is provided an aging pallet comprising a base plate. A driving unit is disposed on the base plate. A plurality of trays is stacked on the driving unit. Each of the plurality of trays includes a seating portion and at least one press bar. The press bar is disposed on the seating portion. A display panel is mounted on the seating portion. The press bar includes a press body and a cover element. The press body extends in a direction which may be referred to as an extension direction. The cover element surrounds the press body. Particle collecting holes are disposed at a surface of the cover element toward the seating portion.

Each of the plurality of trays can include a magnetic element surrounding the press body. The magnetic element can be disposed between the press body and the cover element.

A length of the seating portion in a first direction can be smaller than a length of the seating portion in a second direction. The press body can extend in the second direction. The second direction can be perpendicular to the first direction.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION OF THE EMBODIMENTS

Figure 1:
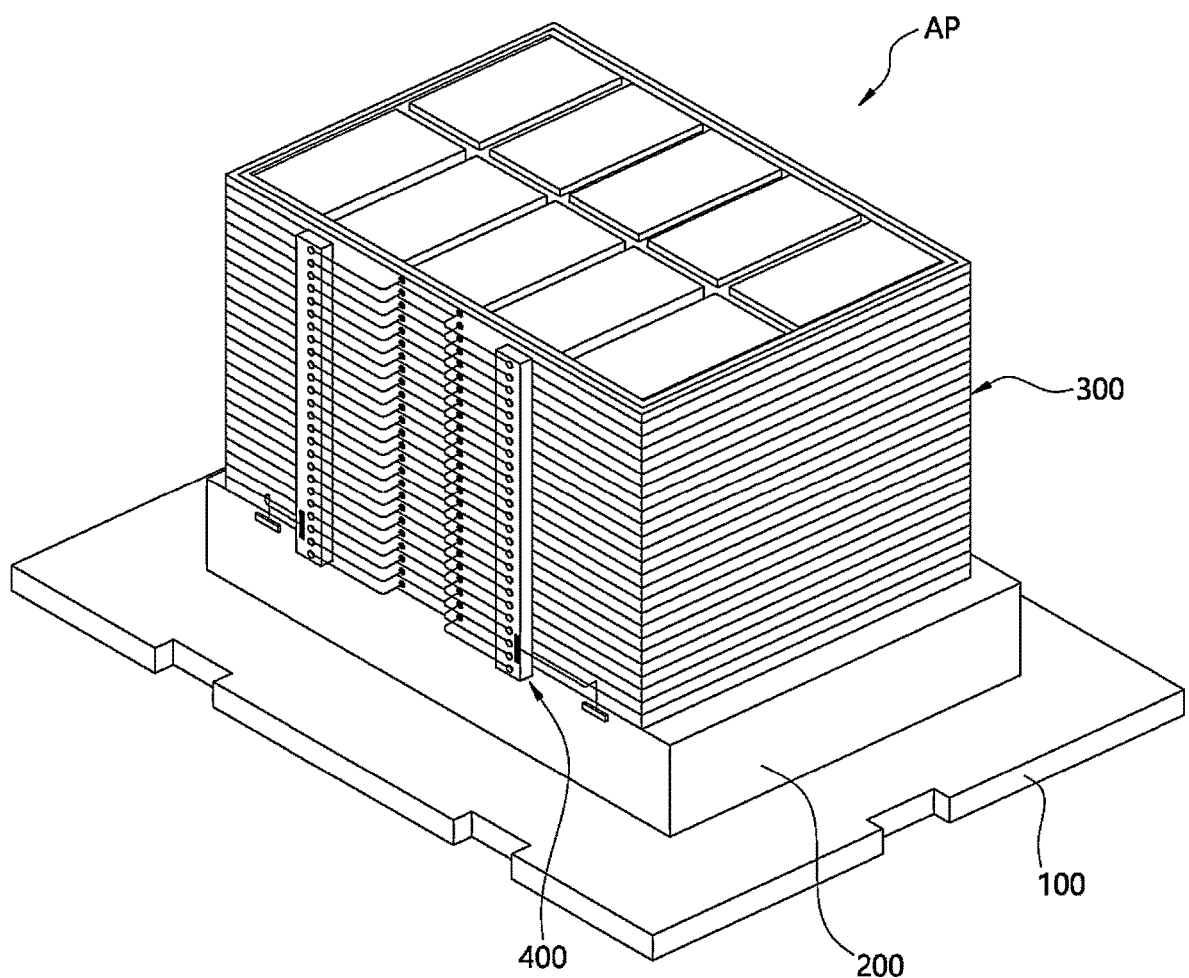
FIG. 1 is a view schematically showing an aging pallet according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure can be embodied in other forms and is not limited to the embodiments described below.

In addition, the same or extremely similar elements can be designated by the same reference numerals throughout the specification and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element from another element, and may not define order. However, the first element and the second element can be arbitrary named according to the convenience of those skilled in the art without departing the technical sprit of the present disclosure.

The terms used in the specification of the present disclosure are merely used in order to describe particular embodiments and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" can means that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

EMBODIMENTS

Figure 2:
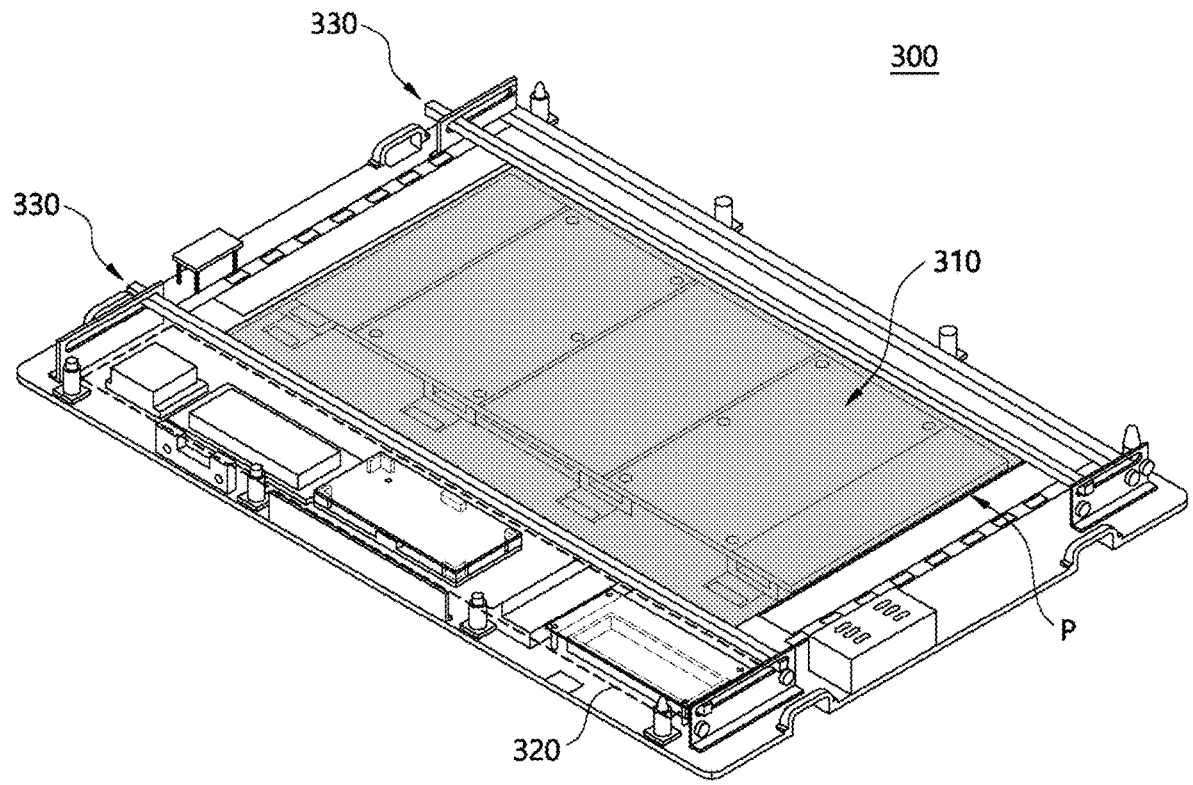
FIG. 2 is a view showing a tray in the aging pallet according to the embodiment of the present disclosure.
Figure 3:
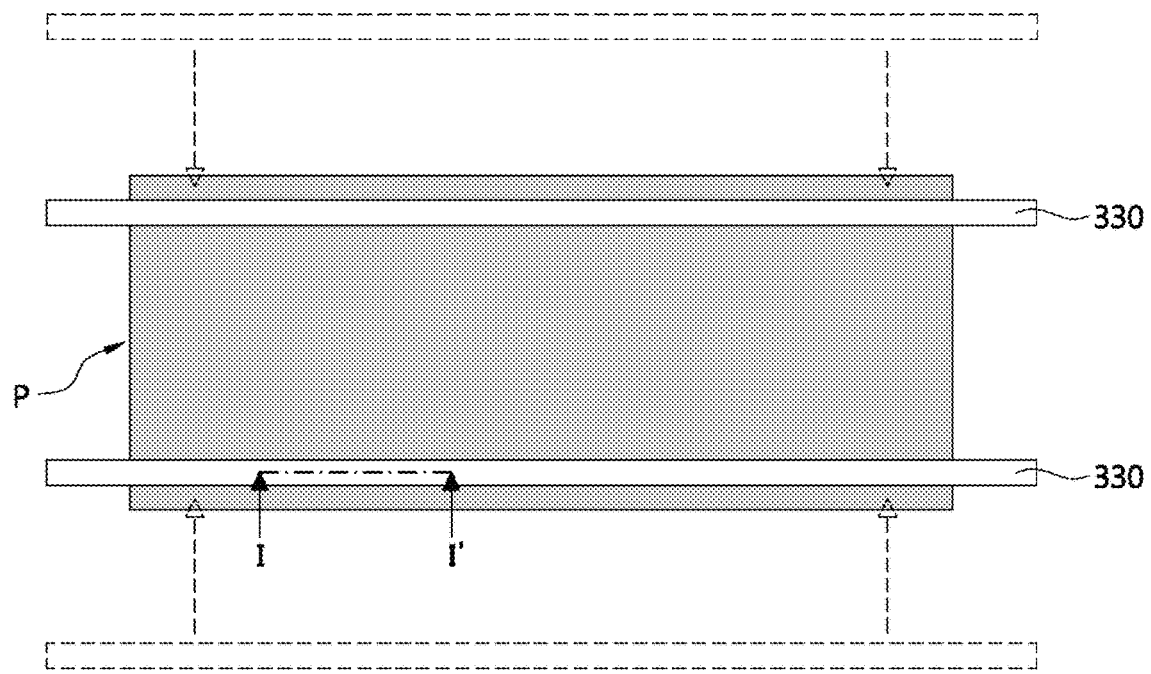
FIG. 3 is a view showing a relative position of a press bar during the aging process in the aging pallet according to the embodiment of the present disclosure.
Figure 4:
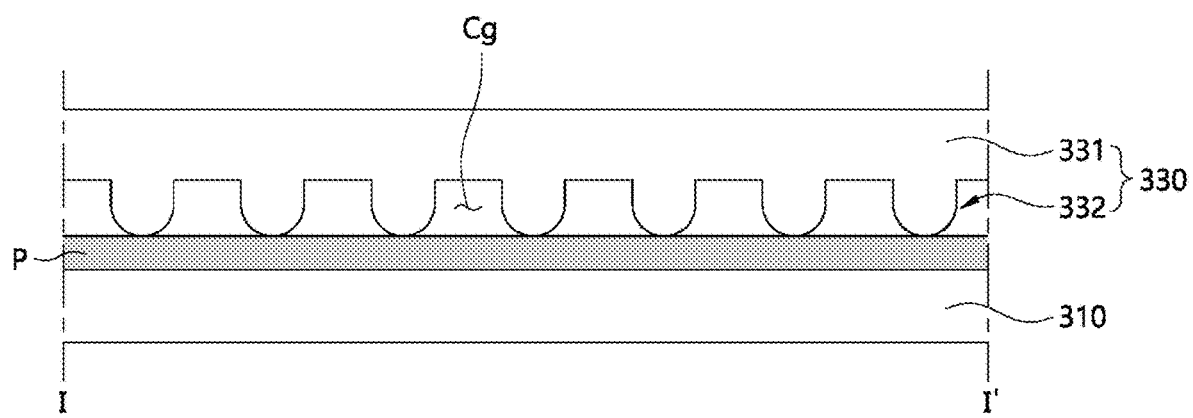
FIG. 4 is a view taken along line I-I' of FIG. 3.

FIG. 1 is a view schematically showing an aging pallet according to an embodiment of the present disclosure. FIG. 2 is a view showing a tray in the aging pallet according to the embodiment of the present disclosure. FIG. 3 is a view showing a relative position of a press bar during the aging process in the aging pallet according to the embodiment of the present disclosure. FIG. 4 is a view taken along line I-I' of FIG. 3.

Referring to FIGS. 1 to 4, an aging pallet AP according to the embodiment of the present disclosure can include a base plate 100, a driving unit 200 and a plurality of trays 300. The base plate 100 can support the driving unit 200 and the trays 300. The plurality of trays 300 can be stacked on the driving unit 200. The driving unit 200 can include a circuit for an aging process. For example, a power unit applying a power voltage to each tray 300 and a controller controlling a display panel P mounted on each tray 300 can be disposed in the driving unit 200.

Each of the plurality of trays 300 can include a seating portion 310, a circuit portion 320 and at least one press bar 330. The display panel P, which is an object of the aging process, can be mounted on the seating portion 310. The circuit portion 320 can transmit a signal for the aging process of the display panel P mounted on the seating portion 310. The press bar 330 can be disposed on the seating portion 310. The display panel P can be a device that provides an image to a user. For example, the display panel P can be a liquid crystal panel or an OLED panel.

The seating portion 310 can support the display panel P during the aging process. For example, the seating portion 310 can include pads supporting a lower surface of the display panel P. A space for the movement of heat can be disposed under the seating portion 310. Thus, in the aging pallet AP according to the embodiment of the present disclosure, the damage to the display panel P due to heat can be prevented.

The circuit portion 320 can transmit a power voltage and an aging signal applied from the driving unit 200 to the display panel P. The circuit portion 320 of each tray 300 can be connected to the driving unit 200, individually. For example, a signal transmitting unit 400 for electrically connecting the driving unit 200 to the circuit portion 320 of each tray 300 can be disposed on a side of each tray 300.

The press bar 330 can press an upper surface of the display panel P mounted on the seating portion 310 during the aging process. The press bar 330 can be moved in a horizontal direction. Thus, in the aging pallet AP according to the embodiment of the present disclosure, a process of mounting the display panel P on the seating portion 310 of each tray 300 can be simplified. For example, the press bar 330 can be moved onto the display panel P, after the display panel P is mounted on the seating portion 310. Therefore, in the aging pallet AP according to the embodiment of the present disclosure, the damage to the display panel P during a movement process for the aging process can be prevented.

The press bar 330 can include a press body 331 and a plurality of protrusions 332 protruding from the press body 331. The press body 331 can extend in a direction which may be referred to as an extension direction. For example, the display panel P can have a rectangular shape in which a length in a first direction is shorter than a length in a second direction perpendicular to the first direction, and the press body 331 can extend in the second direction. The seating portion 310 can have a shape corresponding to the display panel P. For example, a length of the seating portion 310 in the first direction can be shorter than a length of the seating portion 310 in the second direction. For example, in the aging pallet AP according to the embodiment of the present disclosure, the press bar 330 of each tray 300 can extend in a long axis direction of the display panel P.

Each of the plurality of protrusions 332 can protrude from the press body 331 in a direction toward the seating portion 310. For example, an end region of each protrusion 332 toward the seating portion 310 can be in direct contact with an upper surface of the display panel P mounted on the seating portion 310. Thus, in the aging pallet AP according to the embodiment of the present disclosure, bending of a polarizer attached to a surface of the display panel P during the aging process can be prevented. And, in the aging pallet AP according to the embodiment of the present disclosure, the movement of the display panel P during the movement process can be prevented. Therefore, in the aging pallet AP according to the embodiment of the present disclosure, the damage to the display panel P due to the aging process can be prevented.

An end region of each protrusion 332 toward the seating portion 310 can have a curved surface. Thus, in the aging pallet AP according to the embodiment of the present disclosure, the damage to the surface of the display panel P due to the pressing of the press bar 330 can be minimized.

The plurality of protrusions 332 can be disposed side by side in the extension direction of the press body 331. For example, a distance between adjacent protrusions 332 can be constant. Thus, in the aging pallet AP according to the embodiment of the present disclosure, the surface of the display panel P can be uniformly pressed by the plurality of protrusions 332.

Each of the plurality of protrusions 332 can be spaced apart from adjacent protrusions 332. For example, a plurality of particle collecting holes Cg can be formed between the plurality of protrusions 332. Thus, in the aging pallet AP according to the embodiment of the present disclosure, a particle located on a surface of the press body 300 can be moved into one of the plurality of particle collecting holes Cg. For example, in the aging pallet AP according to the embodiment of the present disclosure, the upper surface of the display panel P can be not pressed by the particle located on the surface of the press bar 330 during the aging process. Therefore, in the aging pallet AP according to the embodiment of the present disclosure, the damage to the surface of the display panel P due to the aging process can be prevented.

Accordingly, in the aging pallet AP according to the embodiment of the present disclosure, each tray 300 can include the seating portion 310 on which the display panel P, which is an object of the aging process, is mounted, and at least one press bar 330 disposed on the seating portion 310, wherein the particle collecting holes Cg can be formed at the surface of the press bar 330 toward the seating portion 310 by the plurality of protrusions 332. Thus, in the aging pallet AP according to the embodiment of the present disclosure, the damage to the surface of the display panel P due to the aging process can be prevented. Therefore, in the aging pallet AP according to the embodiment of the present disclosure, the process efficiency can be improved.

FIGS. 5, 6, 7A and 7B are views showing the aging pallet according to another embodiment of the present disclosure.

Figure 5:
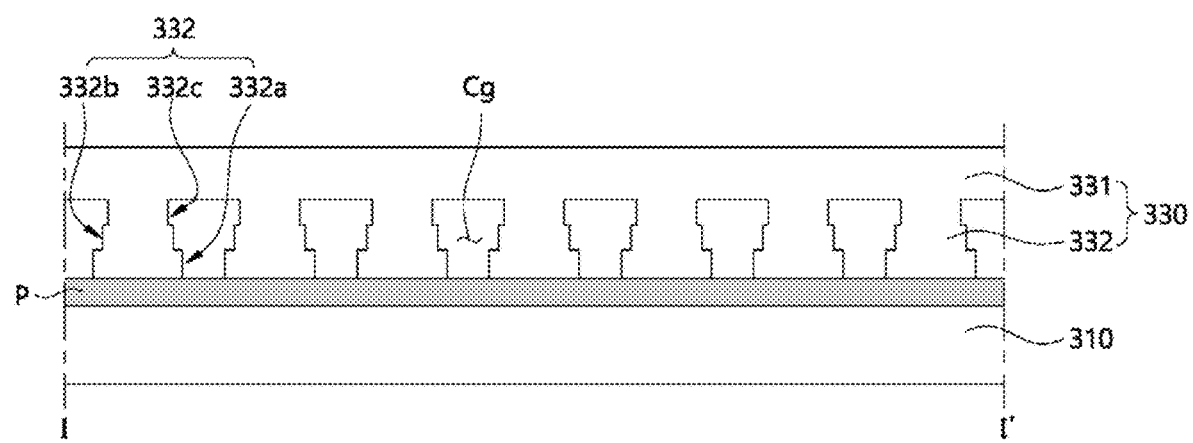
FIGS. 5, 6, 7A and 7B are views showing the aging pallet according to another embodiment of the present disclosure.

In the aging pallet according to another embodiment of the present disclosure, the plurality of protrusions 332 of the press bar 330 can have various shapes. For example, in the aging pallet according to another embodiment of the present disclosure, each protrusion 332 of the press bar 330 can include three regions, specially a first region 332a, a second region 332b and a third region 332c, having different widths, as shown in FIG. 5. The first region 332a of each protrusion 332 can be disposed close to the seating portion 310. The second region 332b and the third region 332c of each protrusion 332 can be sequentially disposed between the first region 332a of the corresponding protrusion 332 and the press body 331. A width of each protrusion 332 can increase as the distance from the press body 331 increases. For example, a width of the second region 332b can be larger than a width of the third region 332c, and a width of the first region 332a can be larger than the width of the second region 332b.

Thus, in the aging pallet according to another embodiment of the present disclosure, a width of each particle collecting hole Cg can increase toward the press body 331. For example, in the aging pallet according to another embodiment of the present disclosure, it can be difficult for the particles moved into the particle collecting holes Cg to re-introduce between the display panel P and the plurality of protrusions 332 during the aging process. Therefore, in the aging pallet according to another embodiment of the present disclosure, the damage to the surface of the display panel P due to the particles can be significantly reduced during the aging process.

Figure 6:
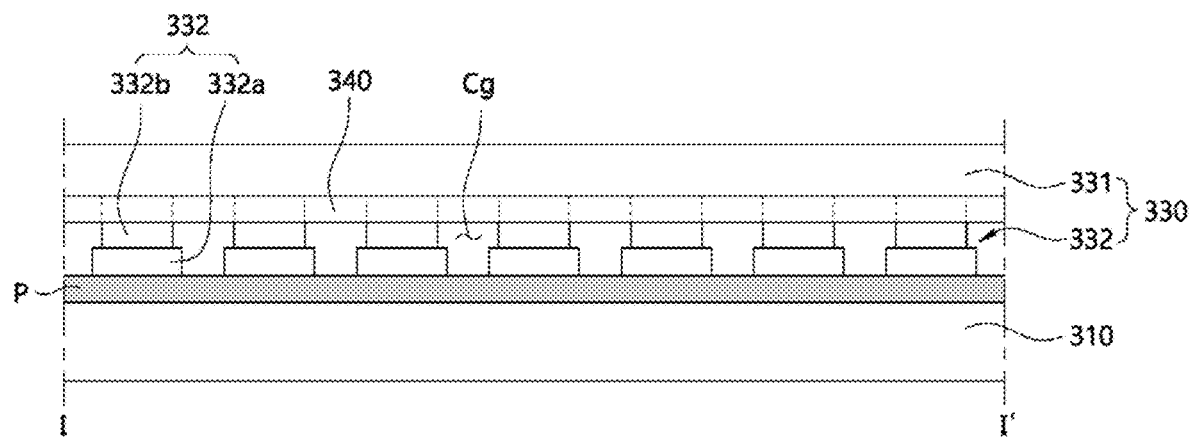

In the aging pallet according to another embodiment of the present disclosure, each protrusion 332 of the press bar 330 can be made of two regions, specially a first region 332a and a second region 332b, having different widths. For example, in the aging pallet according to another embodiment of the present disclosure, each protrusion 332 of the press bar 330 can be made of the first region 332a and the second region 332b having a smaller width than the first region 332a, as shown in FIG. 6. The second region 332b of each protrusion 332 can be disposed between the first region 332a of the corresponding protrusion 332 and the press body 331. Thus, in the aging pallet according to another embodiment of the present disclosure, the degree of freedom for a shape of each protrusion 332 can be improved.

In the aging pallet according to another embodiment of the present disclosure, each of the plurality of trays 300 can include a magnetic element 340 disposed between the second regions 332b of adjacent protrusions 332. For example, the magnetic element 340 can surround a portion of the second region 332b of each protrusion 332. Thus, in the aging pallet according to another embodiment of the present disclosure, a conductive particle can be collected in the particle collecting holes Cg by the magnetic element 340 during the aging process. The conductive particle can include a metal. Therefore, in the aging pallet according to another embodiment of the present disclosure, the damage to the surface of the display panel P due to a relatively hard metal particle can be prevented.

Figure 7A:
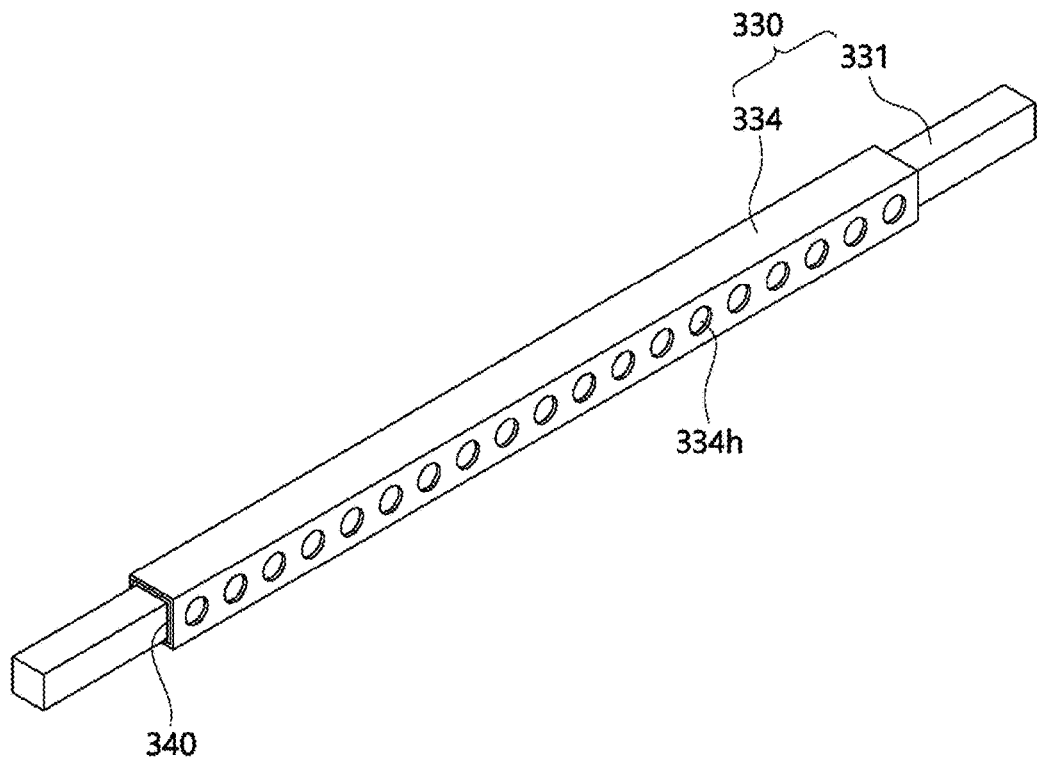
Figure 7B:
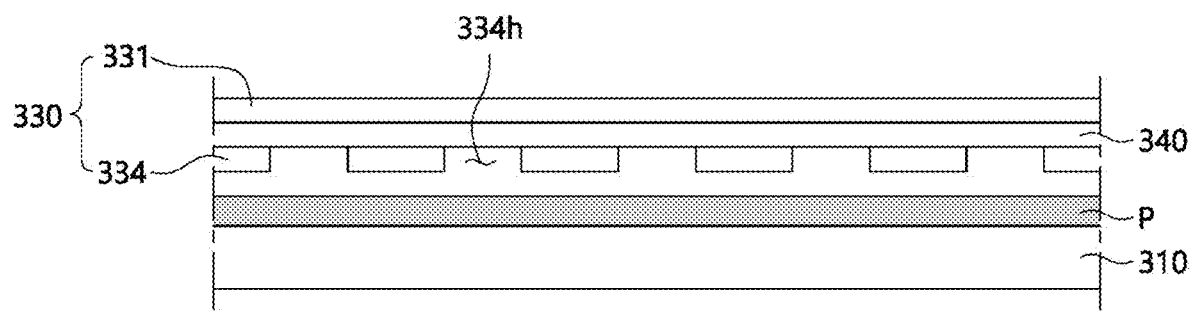

The aging pallet AP according to the embodiment of the present disclosure is described that the press bar 330 includes the plurality of protrusions 332 protruding from the press body 331. However, in the aging pallet according to another embodiment of the present disclosure, the press bar 330 of each tray 300 can have various shapes to provide a space for collecting the particles. For example, in the aging pallet according to another embodiment of the present disclosure, each of the plurality of trays 300 can include the press body 331 extending in a direction which may be referred to as an extension direction, and a cover element 334 surrounding a portion of the press body 331, wherein a plurality of particle collecting hole 334h can be disposed at a surface of the cover element 334 toward the seating portion 310, as shown in FIGS. 7A and 7B.

Thus, in the aging pallet according to another embodiment of the present disclosure, the particles can be collected in the particle collecting holes 334h during the aging process. Therefore, in the aging pallet according to another embodiment of the present disclosure, a space for collecting the particles can be formed in various ways.

In the aging pallet according to another embodiment of the present disclosure, a magnetic element 340 can be disposed between the press body 331 and the cover element 334. For example, in the aging pallet according to another embodiment of the present disclosure, a portion of the magnetic element 340 can be exposed by the particle collecting holes 334h of the cover element 334. Therefore, in the aging pallet according to another embodiment of the present disclosure, the degree of freedom for a method of forming a space capable of collecting various particles can be improved.

As a result, the aging pallet according to the embodiments of the present disclosure can comprise the plurality of trays, wherein each of the plurality of trays can include the seating portion on which the display panel is mounted, and at least one press bar disposed on the seating portion, wherein the press bar can include protrusions protruding toward the seating portion or holes disposed at a surface of the press bar toward the seating portion. Thus, in the aging pallet according to the embodiments of the present disclosure, the particles located on the surface of the press bar can be not press the surface of the display panel. Thereby, in the aging pallet according to the embodiments of the present disclosure, the damage to the display panel due to the aging process can be minimized.

What is claimed is:

1. An aging pallet comprising:
a driving unit on a base plate; and
a plurality of trays stacked on the driving unit,
wherein each of the plurality of trays includes a seating portion on which a display panel is mounted, and at least one press bar disposed on the seating portion, and
wherein the at least one press bar includes a press body extending in a direction which is referred to as an extension direction, and a plurality of protrusions protruding from the press body in a direction toward the seating portion.

2. The aging pallet according to claim 1, wherein the plurality of protrusions are disposed side by side along the extension direction of the press body, and
wherein each of the plurality of protrusions is spaced apart from adjacent protrusions.

3. The aging pallet according to claim 1, wherein each of the plurality of protrusions includes a first region disposed close to the seating portion, and a second region disposed close to the press body, and
wherein a width of the first region is greater than a width of the second region.

4. The aging pallet according to claim 3, wherein each of the plurality of protrusions includes a third region disposed between the press body and the second region, and
wherein a width of the third region is smaller than the width of the first region and the width of the second region.

5. The aging pallet according to claim 1, wherein each of the plurality of trays further includes a magnetic element disposed between adjacent protrusions of the at least one press bar.

6. The aging pallet according to claim 5, wherein a thickness of the magnetic element is smaller than a thickness of each of the protrusions.

7. The aging pallet according to claim 5, wherein the magnetic element surrounds a side of each of the protrusions.

8. The aging pallet according to claim 1, wherein an end region of each of the protrusions toward the seating portion has a curved surface.

9. An aging pallet comprising:
a driving unit disposed on a base plate; and
a plurality of trays stacked on the driving unit,
wherein each of the plurality of trays includes a seating portion on which a display panel is mounted, and at least one press bar disposed on the seating portion,
wherein the at least one press bar includes a press body extending in a direction which is referred to as an extension direction, and a cover element surrounding the press body, and
wherein a plurality of particle collecting holes are disposed at a surface of the cover element toward the seating portion.

10. The aging pallet according to claim 9, wherein each of the plurality of trays further includes a magnetic element surrounding the press body, and
wherein the magnetic element is disposed between the press body and the cover element.

11. The aging pallet according to claim 9, wherein a length of the seating portion in a first direction is smaller than a length of the seating portion in a second direction perpendicular to the first direction, and
wherein the press body extends in the second direction.

* * * * *